US011852685B2

(12) United States Patent
Blazer et al.

(10) Patent No.: US 11,852,685 B2
(45) Date of Patent: Dec. 26, 2023

(54) STIMULATED CIRCUITS AND FAULT TESTING METHODS

(71) Applicant: Hamilton Sundstrand Corporation, Charlotte, NC (US)

(72) Inventors: Christopher Blazer, Machesney Park, IL (US); Brian Ross, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 162 days.

(21) Appl. No.: 17/571,033

(22) Filed: Jan. 7, 2022

(65) Prior Publication Data

US 2023/0221369 A1 Jul. 13, 2023

(51) Int. Cl.
*G01R 31/319* (2006.01)
*G01R 31/3185* (2006.01)

(52) U.S. Cl.
CPC ........ *G01R 31/31926* (2013.01); *G01R 31/318566* (2013.01); *G01R 31/318572* (2013.01)

(58) Field of Classification Search
CPC ...... G01R 31/31926; G01R 31/318566; G01R 31/318572
See application file for complete search history.

(56) References Cited

U.S. PATENT DOCUMENTS

| | | | |
|---|---|---|---|
| 4,471,484 A | 9/1984 | Sedmak | |
| 5,058,112 A * | 10/1991 | Namitz | G06F 11/2215 714/E11.162 |
| 5,831,996 A | 11/1998 | Abramovici et al. | |
| 5,870,408 A | 2/1999 | Aggarwal et al. | |
| 6,536,008 B1 * | 3/2003 | Nadeau-Dostie | G01R 31/318583 714/726 |
| 7,506,232 B2 | 3/2009 | Rajski et al. | |
| 10,963,612 B2 | 3/2021 | Mukherjee et al. | |

(Continued)

OTHER PUBLICATIONS

Ismaeel A.A.: "Testing For Stuck Faults In CMOS Combinational Circuits", IEE Proceedings G. Electronics Circuits & Systems, Institution of Electrical Engineers. Stevenage, GB, vol. 138, No. 2, Apr. 1, 1991, pp. 191-197, XP000225449, ISSN: 0622-0039.

(Continued)

*Primary Examiner* — Nadeem Iqbal
(74) *Attorney, Agent, or Firm* — Locke Lord LLP; Scott D. Wofsy; Daniel J. Fiorello

(57) ABSTRACT

A logic gate system for fault insertion testing can include a logic gate module having a plurality of input pins. The plurality of input pins can include an input signal pin configured to receive an input signal, a power supply input pin configured to receive power from a power supply, and a test input pin. The logic gate module can also include an output pin connected to the input pins via one or more logic gates. The logic gate system can include a power supply line connected to the power supply input pin and the test input pin. The logic gate system can also include a zero-ohm jumper resistor disposed between the power supply input pin and the test input pin. The zero-ohm resistor can be configured to be replaced with a low ohm resistor to allow reverse driving a voltage on the test input pin. The one or more logic gates can be configured to reverse an output at the output pin when the voltage on the test input pin is reverse driven.

18 Claims, 2 Drawing Sheets

During Fault Insertion Test

(56) References Cited

U.S. PATENT DOCUMENTS

2005/0050393 A1     3/2005   Chakraborty et al.
2019/0041452 A1     2/2019   Chang et al.
2019/0363531 A1   11/2019   Ostrovsky

OTHER PUBLICATIONS

Extended European Search Report issued by the European Patent Office, dated Jun. 15, 2023, in corresponding European Patent Application No. 22215185.4.

\* cited by examiner

Normal Operation

During Fault Insertion Test ies US 11,852,685 B2

STIMULATED CIRCUITS AND FAULT TESTING METHODS

FIELD

This disclosure relates to stimulated circuits and fault testing methods.

BACKGROUND

Traditional fault insertion testing is effected by causing the stimulated (stim) circuits to act opposite to how they are commanded. These stim circuits can have a configurable logic gate acting as a buffer or inverter (e.g., mostly buffers) between a microprocessor (which drives the stims) and the actual circuit being stimmed. Traditional systems require several components to connect to a stim circuit to fault test the stim circuit, which makes it a time consuming operation to do fault testing.

Such conventional methods and systems have generally been considered satisfactory for their intended purpose. However, there is still a need in the art for improved stim circuits and testing methods. The present disclosure provides a solution for this need.

SUMMARY

A logic gate system for fault insertion testing can include a logic gate module having a plurality of input pins. The plurality of input pins can include an input signal pin configured to receive an input signal, a power supply input pin configured to receive power from a power supply, and a test input pin. The logic gate module can also include an output pin connected to the input pins via one or more logic gates. The logic gate system can include a power supply line connected to the power supply input pin and the test input pin. The logic gate system can also include a zero-ohm jumper resistor disposed between the power supply input pin and the test input pin. The zero-ohm resistor can be configured to be replaced with a low ohm resistor to allow reverse driving a voltage on the test input pin. The one or more logic gates can be configured to reverse an output at the output pin when the voltage on the test input pin is reverse driven (e.g., pulled low).

The system can include a test pad connected to the power supply line configured to receive a test fixture for reverse driving voltage (e.g., pulling voltage low) on the test input pin. Any other suitable electrical connection type is contemplated herein.

The logic gate module can include four or five total input pins. Any suitable number of input pins (e.g., more than three) is contemplated herein.

In certain embodiments, the logic gate module can be a buffer. In certain embodiments, the logic gate module can be an inverter. Any suitable function for the logic gate module is contemplated herein.

In accordance with at least one aspect of this disclosure, a method for fault insertion testing in a circuit can include removing a zero-ohm resistor between a power supply input pin and a test input pin, inserting a low-ohm resistor in place of the zero-ohm resistor, connecting a test fixture to be in electrical communication with the low-ohm resistor and the test input pin on a test input pin side of the low-ohm resistor, and reverse driving voltage (e.g., pulling voltage low) at the test input pin to change an output of the logic module. Connecting the test fixture can include connecting to a test pad that is electrically connected to the low-ohm resistor and the test input pin. The logic gate module can be any suitable logic gate module disclosed herein (e.g., as described above). Reverse driving voltage (e.g., pulling voltage low) on the test input pin can cause the output at the output pin to reverse such that a buffer acts like and inverter and an inverter acts like a buffer.

In accordance with at least one aspect of this disclosure, a system configured for fault insertion testing can include an input module configured to output an input signal, and a logic gate system for fault insertion testing, e.g., as disclosed herein (e.g., as described above). The input signal pin can be connected to the input module and configured to receive the input signal from the input module. The system can also include a circuit-to-be-tested connected to the output pin to receive the output from the logic gate module.

In certain embodiments, the system can include a test pad connected to the power supply line configured to receive a test fixture for reverse driving voltage (e.g., pulling voltage low) on the test input pin. In certain embodiments, the system can include the test fixture.

The input module can be a processor, for example. In certain embodiments, the system can be an aircraft system. For example, the aircraft system can be a health monitoring system.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
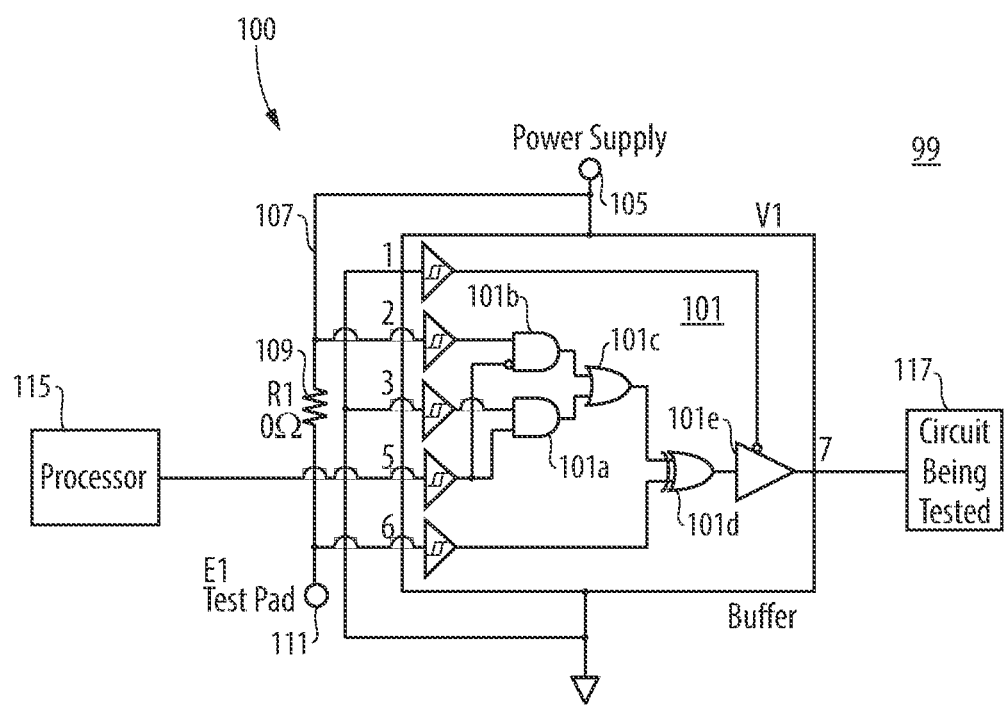
FIG. 1 is a schematic diagram of an embodiment of a system in accordance with this disclosure, shown in a normal operation state.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIG. 2.

Figure 2:
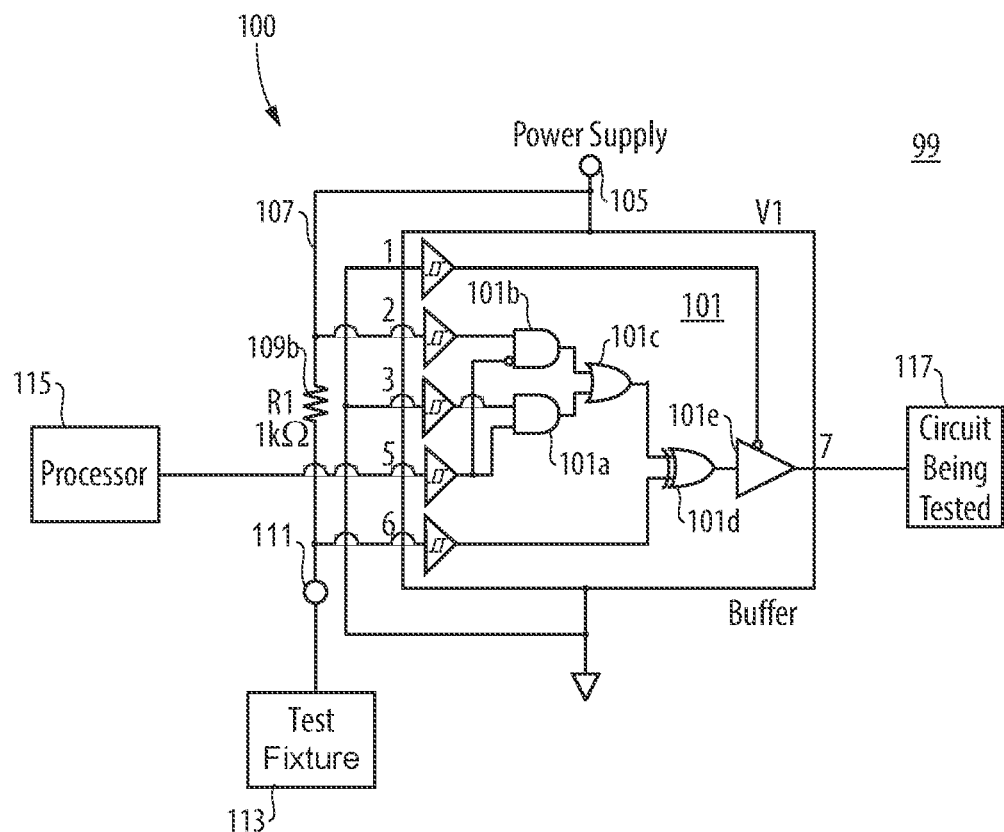
FIG. 2 is a schematic diagram of an embodiment of a system (e.g., the system of FIG. 1) in accordance with this disclosure, shown in a fault insertion test state.

Referring to FIGS. 1 and 2, a logic gate system 100 for fault insertion testing can include a logic gate module 101 having a plurality of input pins (e.g., pins 1, 2, 3, 5, and 6 as shown). The plurality of input pins 1, 2, 3, 5, 6 can include an input signal pin 5 configured to receive an input signal, a power supply input pin 2 configured to receive power from a power supply 105, and a test input pin 6. The logic gate module 101 can also include an output pin 7 connected to the input pins 1, 2, 3, 5, 6 via one or more logic gates 101a, 101b, 101c, 101d, 101e (e.g., including one or more AND operators, one or more OR operators, one or more XOR operators, one or more gain blocks, and/or any other suitable logic block type).

The logic gate system 100 can include a power supply line 107 connected to the power supply input pin 2 and the test input pin 6. The logic gate system 100 can also include a zero-ohm jumper resistor 109 disposed between the power supply input pin 2 and the test input pin 6. The zero-ohm resistor 109 can be configured to be replaced with a low ohm resistor (e.g., equal to or less than about 1 k ohms) to allow reverse driving a voltage on the test input pin. The one or more logic gates can be configured to reverse an output at the output pin 7 when the voltage on the test input pin 6 is reverse driven (e.g., pulled low).

The system 100 can include a test pad 111 (e.g., a large metallic area for soldering, a fitting for a releasable connection) connected to the power supply line 107 configured to receive a test fixture 113 (e.g., having test circuitry) for reverse driving voltage (e.g., pulling voltage low) on the test input pin 6. Any other suitable electrical connection type is contemplated herein.

The logic gate module 101 can include four or five total input pins (e.g., five pins 1, 2, 3, 5, 6 as shown) for example. Any suitable number of input pins (e.g., more than three) is contemplated herein.

In certain embodiments, the logic gate module 101 can be a buffer. In certain embodiments, the logic gate module 101 can be an inverter. Any suitable function for the logic gate module 101 is contemplated herein. The logic gate module 101 can include any suitable hardware and/or software module(s) configured to perform any suitable function (e.g., logic gates).

In accordance with at least one aspect of this disclosure, a system 99 configured for fault insertion testing can include an input module 115 configured to output an input signal, and a logic gate system for fault insertion testing, e.g., as disclosed herein (e.g., system 100 as described above). The input signal pin 5 can be connected to the input module 115 and configured to receive the input signal from the input module 115. The system 99 can also include a circuit-to-be-tested 117 connected to the output pin 7 to receive the output from the logic gate module 101.

In certain embodiments, the system 99 can include a test pad 111 connected to the power supply line 107 configured to receive a test fixture 113 for reverse driving voltage (e.g., pulling voltage low) on the test input pin 6. In certain embodiments, the system 99 can include the test fixture 113.

The input module 115 can be a processor, for example. Any suitable input module 115 is contemplated herein. In certain embodiments, the system 99 can be an aircraft system. For example, the aircraft system can be a health monitoring system.

In accordance with at least one aspect of this disclosure, a method for fault insertion testing in a circuit (e.g., circuit 117) can include removing a zero-ohm resistor 109 between a power supply input pin 2 and a test input pin 6, inserting a low-ohm resistor 109b (e.g., as shown in FIG. 2) in place of the zero-ohm resistor 109 (as shown in FIG. 1), connecting a test fixture 113 to be in electrical communication with the low-ohm resistor 109b and the test input pin 6 on a test input pin side of the low-ohm resistor 109b, and reverse driving voltage (e.g., pulling voltage low) at the test input pin 6 to change an output of the logic module 101 (at output pin 7). By reverse driving voltage (e.g., pulling voltage low) at the test pin 6, the logic of the module 101 (e.g., logic gate 101d) will see a low signal from test input pin 6 instead of the usual power supply signal. As shown, the logic gate 101d can be an XOR logic gate configured to switch its output when the voltage is low on the test input pin 6 connected thereto, while the other pin inputs remain the same, for example. Any suitable logic block or function to cause logic module 101 output state switching with change of the test input pin signal is contemplated herein.

In certain embodiments, connecting the test fixture 113 can include connecting to a test pad 111 that is electrically connected to the low-ohm resistor and the test input pin. The logic gate module 101 can be any suitable logic gate module disclosed herein (e.g., as described above). Reverse driving voltage (e.g., pulling voltage low) on the test input pin 6 can cause the output at the output pin 7 to reverse such that a buffer acts like an inverter and an inverter acts like a buffer. Any other suitable function is contemplated herein.

Embodiments enable quick fault insertion to cause a circuit to act in reverse. This can be done to check if software or other suitable logic in the system is catching those faults. Traditional systems require substantial physical rework to do such tests and also require the use of switches and other electronics parts. Traditional methods also require many parts, solder joints, etc. Embodiments, however, allow this type of testing without the rework. For example, stimulated (stim) circuits are made to health test a system before it is allowed to work. Fault insertion testing can be used to test these health monitoring circuits to make sure they are functioning properly.

Embodiments can utilize new logic gate modules that have an extra test pin that can be driven to change the output state of the logic gate module.

Embodiments can use a logic module that is an ultra-configurable gate (e.g., SN74LVC1G99-Q1) instead of previous basic configurable gates that were traditionally used. There is one or more extra input pins in such ultra-configurable parts, for example. An extra pin can be the difference between configuring the gate as a buffer or an inverter, for example. Certain embodiments can have the extra pin (e.g., pin 6) tied to the power supply to be a buffer. Embodiments can pull that test pin to ground through a resistor (e.g., 1 k or less during fault insertion testing). The value can be small so that when the test input pin is pulled to ground, noise does not create any significant voltage across the resistor and make the gate see a high signal when the pin is in fact being pulled down. In certain embodiments, that resistor can be a zero ohm jumper and during fault insertion testing, it could be replaced with the low value resistor. In this regard, it can aid in assuring that there are no issues with certain hardware. Also, to make it easier to connect the test lead, embodiments can also include a small test pad, e.g., between the test input pin and the resistor to give a place for the test lead to connect to.

Using embodiments can decrease the amount of rework for fault insertion testing for the stimmed circuits. Embodiments require a lot less pins to be lifted and a lot less switches and resistors to be added to the board. Embodiments can still use an external test fixture, but instead of the external test fixture controlling a switch that has been added to the board, the external test fixture can connect to the test lead between the test input pin and resistor and either drive it high or low depending on the test.

Embodiments include a method of only two steps. For example, reworking the circuit for fault insertion testing can include replacing R1 0Ω jumper with a 1 k resistor and connecting the jumper from a test pad to an external test fixture connector. While embodiments show a buffer being converted to an inverter, the same method can be used to convert an inverter to a buffer for the same benefits during fault insertion testing. This method can be used on input stim circuits and output monitor circuits, as well as any other suitable circuits.

Embodiments reduce the amount of rework (effort/time) needed for fault insertion testing. Using an ultra-configurable gate, there is one pin difference between configuring as a buffer or as an inverter. These buffers/inverters are used between stim driving signals and the circuits being stimmed. Using the ultra-configurable gate, with a resistor provision (normally 0 ohm but increased during testing) between the pin and either ground or supply, the node can be tied into via a test pad to convert buffers to inverters and inverters to buffers during fault insertion testing. Embodiments can provide a significant reduction in rework needed to induce faults. This includes, for example, a reduction of external components that are needed to be added to the board (switches/pull up or down resistors), reduction of lifting pins, and connecting jumpers to switches and jumpers from switches to power and ground connections for the switches.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A logic gate system for fault insertion testing, comprising:
    a logic gate module having:
        a plurality of input pins, the plurality of input pins comprising:
            an input signal pin configured to receive an input signal;
            a power supply input pin configured to receive power from a power supply; and
            a test input pin; and
        an output pin connected to the input pins via one or more logic gates;
    a power supply line connected to the power supply input pin and the test input pin; and
    a zero-ohm jumper resistor disposed between the power supply input pin and the test input pin, wherein the zero-ohm resistor is configured to be replaced with a low ohm resistor to allow reverse driving a voltage on the test input pin, wherein the one or more logic gates are configured to reverse an output at the output pin when the voltage on the test input pin is reverse driven.

2. The system of claim 1, further comprising a test pad connected to the power supply line configured to receive a test fixture for reverse driving voltage on the test input pin.

3. The system of claim 2, wherein the logic gate module includes four or five total input pins.

4. The system of claim 1, wherein the logic gate module is a buffer.

5. The system of claim 1, wherein the logic gate module is an inverter.

6. A method for fault insertion testing in a circuit, the method comprising:
    removing a zero-ohm resistor between a power supply input pin and a test input pin;
    inserting a low-ohm resistor in place of the zero-ohm resistor;
    connecting a test fixture to be in electrical communication with the low-ohm resistor and the test input pin on a test input pin side of the low-ohm resistor; and
    reverse driving voltage at the test input pin to change an output of a logic module.

7. The method of claim 6, wherein connecting the test fixture includes connecting to a test pad that is electrically connected to the low-ohm resistor and the test input pin.

8. The method of claim 6, wherein the logic gate module is the logic gate module includes:
    a plurality of input pins, the plurality of input pins comprising:
        an input signal pin configured to receive an input signal;
        a power supply input pin configured to receive power from a power supply; and
        a test input pin; and
    an output pin connected to the input pins via one or more logic gates.

9. The method of claim 8, wherein reverse driving voltage on the test input pin causes the output at the output pin to reverse such that a buffer acts like an inverter and an inverter acts like a buffer.

10. A system configured for fault insertion testing, comprising:
    an input module configured to output an input signal;
    a logic gate system for fault insertion testing, comprising:
        a logic gate module having:
            a plurality of input pins, the plurality of input pins comprising:
                an input signal pin connected to the input module and configured to receive the input signal from the input module;
                a power supply input pin configured to receive power from a power supply; and
                a test input pin; and
            an output pin connected to the input pins via one or more logic gates;
        a power supply line connected to the power supply input pin and the test input pin; and
        a zero-ohm jumper resistor disposed between the power supply input pin and the test input pin, wherein the zero-ohm resistor is configured to be replaced with a low ohm resistor to allow reverse driving a voltage on the test input pin, wherein the one or more logic gates are configured to reverse an output at the output pin when the voltage on the test input pin is reverse driven; and
    a circuit-to-be-tested connected to the output pin to receive the output from the logic gate module.

11. The system of claim 10, further comprising a test pad connected to the power supply line configured to receive a test fixture for reverse driving voltage on the test input pin.

12. The system of claim 11, further comprising the test fixture.

13. The system of claim 11, wherein the logic gate module includes four or five total input pins.

14. The system of claim 10, wherein the logic gate module is a buffer.

15. The system of claim 10, wherein the logic gate module is an inverter.

16. The system of claim 10, wherein the input module is a processor.

17. The system of claim 16, wherein the system is an aircraft system.

18. The system of claim 17, wherein the aircraft system is a health monitoring system.

\* \* \* \* \*